(12) United States Patent
Itou et al.

(10) Patent No.: US 8,507,857 B2
(45) Date of Patent: Aug. 13, 2013

(54) CHARGED PARTICLE BEAM INSPECTION APPARATUS AND INSPECTION METHOD USING CHARGED PARTICLE BEAM

(75) Inventors: Keisuke Itou, Tokyo (JP); Toshimichi Iwai, Tokyo (JP)

(73) Assignee: Advantest Corp., Tokyo (JP)

( * ) Notice: Subject to any disclaimer, the term of this patent is extended or adjusted under 35 U.S.C. 154(b) by 372 days.

(21) Appl. No.: 12/653,013

(22) Filed: Dec. 7, 2009

(65) Prior Publication Data
US 2010/0102225 A1     Apr. 29, 2010

Related U.S. Application Data

(63) Continuation of application No. PCT/JP2007/061654, filed on Jun. 8, 2007.

(51) Int. Cl.
*G21K 7/00*     (2006.01)
(52) U.S. Cl.
USPC ............. 250/310; 250/307; 250/396 R
(58) Field of Classification Search
USPC ................................................ 250/310
See application file for complete search history.

(56) References Cited

U.S. PATENT DOCUMENTS

| | | | |
|---|---|---|---|
| 5,412,210 A * | 5/1995 | Todokoro et al. | 850/9 |
| 7,176,468 B2 * | 2/2007 | Bertsche et al. | 250/399 |
| 7,241,996 B2 * | 7/2007 | Suzuki et al. | 250/310 |
| 2006/0016990 A1 | 1/2006 | Suzuki et al. | |

FOREIGN PATENT DOCUMENTS

| | | |
|---|---|---|
| JP | 08-138617 | 5/1996 |
| JP | 2002-118158 | 4/2002 |
| JP | 2003-142019 | 5/2003 |
| JP | 2004-008678 | 1/2004 |
| JP | 2004-014207 | 1/2004 |
| JP | 2004-014485 | 1/2004 |
| JP | 2007-109490 | 4/2007 |
| WO | WO 98/32153 | 7/1998 |

OTHER PUBLICATIONS

Office Action from the Taiwa Patent Office for the counterpart Taiwan patent application and its English translation.

* cited by examiner

*Primary Examiner* — Phillip A Johnston
(74) *Attorney, Agent, or Firm* — Muramatsu & Associates

(57) ABSTRACT

A charged particle beam inspection apparatus includes: an electron gun emitting an electron beam; first and second condenser lenses used to focus the electron beam; a beam control panel disposed between the first and second condenser lenses; and a control unit performing stabilizing processing in which excitation currents respectively supplied to the first condenser lens and the second condenser lens are set to have predetermined values, thereby the current amount of the electron beam passing through an opening of the beam control panel is regulated so that the electron beam to be emitted onto the sample has a larger current amount than that at a measurement, and then the electron beam is emitted onto the sample for a predetermined time period. After the stabilizing processing, the control unit sets the values of the excitation currents back to values for the measurement in order to measure dimensions of the sample, the excitation currents respectively supplied to the first and second condenser lenses.

7 Claims, 8 Drawing Sheets

CHARGED PARTICLE BEAM INSPECTION APPARATUS AND INSPECTION METHOD USING CHARGED PARTICLE BEAM

CROSS-REFERENCE TO RELATED APPLICATIONS

This application is a continuation of prior International Patent Application No. PCT/JP2007/061654, filed Jun. 8, 2007, the entire contents of which are incorporated herein by reference.

BACKGROUND OF THE INVENTION

1. Field of the Invention

The present invention relates to: a charged particle beam inspection apparatus used to observe or inspect a sample while emitting a charged particle beam such as an electron beam onto the sample; and an inspection method using a charged particle beam.

2. Description of the Prior Art

In a manufacturing process of a semiconductor device, an electron beam apparatus such as an electron microscope is used to observe a sample or to measure a line width of a pattern or the like. During the observation or measurement of the sample, such an electron beam apparatus scans the sample while emitting an electron beam onto an observation target portion of the sample, and converts the amount of electrons such as secondary electrons into luminance which is then displayed as an image on a display device.

During such observation or measurement of the sample, an electron beam is emitted (irradiated) onto the sample. Here, this emission of the electron beam causes a phenomenon in which a surface of the sample is charged. Specifically, the irradiated surface of the sample is charged positively or negatively depending on the difference between the charge of charged particles incident on the sample and the charge of charged particles emitted therefrom. Additionally, in accordance with the charge potential on the surface of the sample, the emitted secondary electrons may be accelerated or drawn onto the sample. This changes efficiency of emitting secondary electrons. Consequently, a problem arises that results obtained from detecting the amounts of electrons cannot be stable. Moreover, if the charge potential is unchanged, it does not adversely affect anything, however, if the charge potential changes with time, the charge potential on the surface of the sample changes an acceleration condition or a deflection condition of a primary electron beam. This causes a problem that an accurate measurement is not maintained.

To address these problems, various methods to prevent charging on a sample have been proposed.

As a technique related to the above, Japanese Patent Application Publication No. 2003-142019 discloses a method of controlling charging on a sample surface by use of an acceleration voltage at which the yield of the secondary electrons is greater than 1 and an acceleration voltage at which the yield of the secondary electrons is smaller than 1. This method of controlling the charging on the sample surface with use of the acceleration voltages may not ensure the measurement accuracy before and after the changes of the acceleration voltages.

During the sample observation using the electron beam apparatus, the phenomenon of charging the sample occurs as described above. In this respect, if electrical connection of the sample is possible, as in the case of a semiconductor wafer, for example, the charging phenomenon on the sample is less likely to occur, because the wafer can discharge electricity by having a conductor on the electrically connected wafer grounded. In this case, charging is not a problem in practical use.

On the other hand, if the sample is non-conductive, or if the sample, even though made of a conductive material, is incapable of being grounded and thus is in an electrically floating state, there arises a problem that a charging state of the sample changes with time, so that a measurement target image drifts accordingly.

In a case, for example, where dimensions of a photomask used as an original plate for exposing a semiconductor are measured, charging occurs in the following two states. The first state is where a conductor such as chromium entirely lies on a glass substrate which is in the course of having wirings manufactured and where a resist wiring used for etching a wiring to chromium lies on the conductor. The second state is where the processing of manufacturing the wirings are completed so that a wiring made of the conductor such as chromium lies on the glass substrate.

Especially in the measurement after the etching process, most of the wiring patterns on the mask become incapable of being electrically grounded and thus are in an electrically floating state. In such a case, the surface potential of the measurement target wiring becomes extremely unstable.

This charging phenomenon changes with time and continues until the potential is stabilized. Therefore, after the potential is stabilized, a sample can be observed or measured stably. However, it takes a long time, several tens of seconds, for example, until the potential is finally stabilized. This leads to a problem of deterioration in throughput of measurement processing.

SUMMARY OF THE INVENTION

The present invention has been made in consideration of the above-described problems in the conventional techniques, and aims to provide: a charged particle beam inspection apparatus which is capable of easily stabilizing the potential on a sample surface in a short time, and is capable of measuring a sample with accuracy; and an inspection method using a charged particle beam.

The above-described objects are achieved by a charged particle beam inspection apparatus including: an electron gun emitting an electron beam; a first condenser lens and a second condenser lens used to focus the electron beam; a beam control panel provided between the first condenser lens and the second condenser lens; and a control unit performing stabilizing processing in which excitation currents respectively supplied to the first condenser lens and the second condenser lens are set to have predetermined values, thereby the current amount of the electron beam passing through an opening of the beam control panel is regulated so that the electron beam to be emitted (irradiated) onto the sample has a larger current amount than that at a measurement, and then the electron beam is emitted onto the sample for a predetermined time period.

In the above-described charged particle beam inspection apparatus, after finishing the stabilizing processing, the control unit may set the values of the excitation currents back to values for the measurement, and then the measurement of a dimension of the sample may be performed, the excitation currents respectively supplied to the first condenser lens and the second condenser lens.

Moreover, in the above-described charged particle beam inspection apparatus, in the stabilizing processing, the control unit may set the excitation current to be supplied to the first condenser lens lower smaller than the excitation current supplied thereto for the measurement, to increase a focal distance of the first condenser lens, and may set the excitation current to be supplied to the second condenser lens higher larger than the excitation current supplied thereto for the measurement, to regulate a focal distance of the second condenser lens to be equal to a focal distance thereof for the measurement.

In the present invention, the excitation current supplied to the first condenser lens in the stabilizing processing is set to be smaller than that supplied thereto for the measurement, in order to increase the focal distance of the first condenser lens. Consequently, the area of the beam control panel on which the electron beam is emitted is narrowed so that the amount of the electron beam passing through the opening of the beam control panel is relatively increased compared to that for the measurement. As a consequence, the amount of current of the electron beam emitted (irradiated) on the sample is increased. The emission, for a predetermined time period, of a large amount of electron beam thus regulated makes it possible to stabilize the potential on a sample surface in a short time. As a result, a track of the electron beam is made steady, and dimensions of a pattern on the sample can be measured with accuracy.

Moreover, the above-described charged particle beam inspection apparatus may further include a storage to store the values of the excitation currents to be respectively supplied to the first condenser lens and the second condenser lens. The control unit may sequentially: extract, from the storage, a value of a first excitation current to be supplied to the first condenser lens, a value of a second excitation current to be supplied to the second condenser lens, and an emission time period, the values and the emission time period set for the stabilizing processing; supply the first excitation current to the first condenser lens to make a focal distance of the first condenser lens longer than a focal distance thereof for the measurement; supply the second excitation current to the second condenser lens to regulate a focal distance of the second condenser lens to be equal to a focal distance thereof for the measurement; and emit the electron beam onto the sample for the emission time period to stabilize a potential on a surface of the sample.

In the present invention, the amount of current to be supplied to each of the first and the second condenser lenses (one of stabilizing conditions) is obtained in advance in order to stabilize the above-described potential. Here, the amount of current corresponds to a desired time period taken for stabilizing. The stabilizing conditions for each sample are stored in the storage. Since the charged particle beam inspection apparatus automatically performs the stabilizing processing with reference to the stabilizing conditions stored in the storage, a user can save time and labor considerably.

Meanwhile, the above-described problems are solved by a charged particle beam inspection apparatus including: an electron gun which emits an electron beam; a first condenser lens forming, upon receipt of the electron beam emitted from the electron gun, a first focused beam which focuses at a position located a predetermined first focal distance away from the first condenser lens; a beam control panel forming a passed beam upon receipt of the first focused beam, the passed beam formed of a portion of the first focused beam passing through a predetermined opening formed in the beam control panel and located at an axial center; a second condenser lens forming, upon receipt of the passed beam, a second focused beam which focuses at a position located a predetermined second focal distance away from the second condenser lens; an objective lens emitting, upon receipt of the second focused beam, the second focused beam onto an irradiation target sample a predetermined third focal distance away from the objective lens; and a control unit controlling, in order to stabilize a potential on a surface of the sample, focusing conditions for the first condenser lens and the second condenser lens by changing the first focal distance and the second focal distance in a way that the passed beam passing through the opening becomes larger.

In addition, another aspect of the present invention is an inspection method using the charged particle beam inspection apparatus according to the above aspect. The inspection method according to the aspect is to measure a dimension of a pattern formed on a sample by use of a charged particle beam inspection apparatus, the apparatus including: an electron gun emitting an electron beam; a first condenser lens and a second condenser lens to focus the electron beam; a beam control panel provided between the first condenser lens and the second condenser lens; a storage to store values of excitation currents to be respectively supplied to the first condenser lens and the second condenser lens; and a control unit for controlling the electron gun, the first condenser lens, and the second condenser lens. The method includes the steps of: extracting, from the storage, the value of the excitation current to be supplied to the first condenser lens, the value of the excitation current to be supplied to the second condenser lens, and an emission time period; supplying the excitation currents respectively to the first condenser lens and the second condenser lens to regulate the electron beam passing through an opening of the beam control panel so that the electron beam to be emitted (irradiated) onto the sample has a larger current amount than that at the measurement; emitting the electron beam onto the sample for the emission time period which is extracted from the storage; and after the emission of the electron beam, and after the foregoing steps for stabilizing processing, measuring the pattern on the sample by setting the values of the excitation currents to be supplied respectively to the first condenser lens and the second condenser lens back to values for the measurement.

DESCRIPTION OF THE PREFERRED EMBODIMENT

Hereinbelow, descriptions will be given of an embodiment of the present invention with reference to the drawings.

Firstly, a description will be given of a configuration of a charged particle beam inspection apparatus. Secondly, a description will be given of processing to stabilize a potential on a sample surface, which is an aspect of the present invention. Subsequently, a description will be given of an inspection method using a charged particle beam by use of the charged particle beam inspection apparatus.

(Configuration of Charged Particle Beam Inspection Apparatus)

Figure 1:
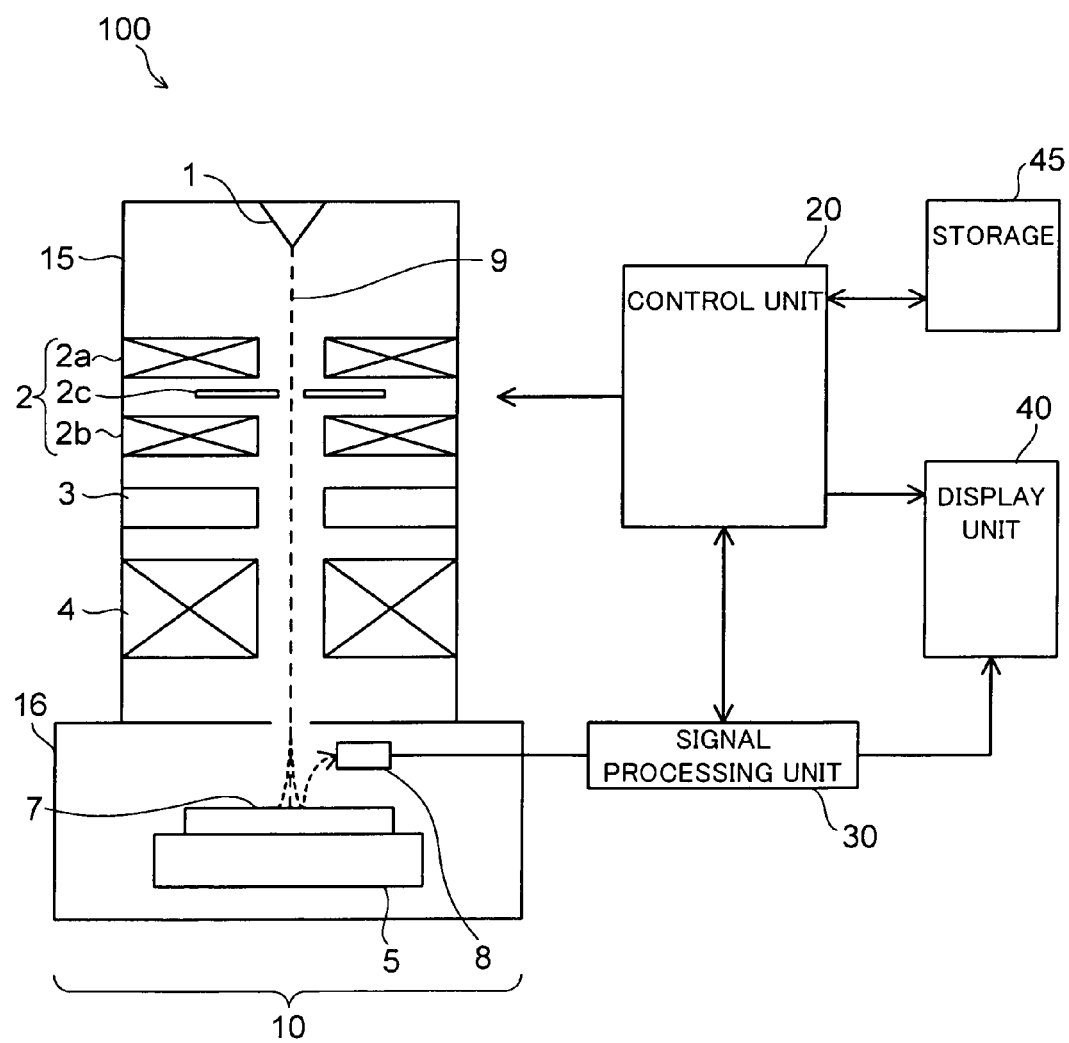
FIG. 1 is a configuration diagram of a charged particle beam inspection apparatus employed in an embodiment of the present invention.

FIG. 1 is a configuration diagram of the charged particle beam inspection apparatus according to the embodiment.

The charged particle beam inspection apparatus 100 mainly includes: an electron scanning unit 10; a signal processing unit 30; a display unit 40; and a control unit 20 for controlling the electron scanning unit 10, the signal processing unit 30, and the display unit 40. As shown, the electron scanning unit 10 includes an electron lens tube unit (column) 15 and a sample chamber 16.

The electron lens tube unit 15 includes an electron gun 1, a condenser lens unit 2, a deflection coil 3, and an objective lens 4. The condenser lens unit 2 includes a first condenser lens 2a, a second condenser lens 2b, and a beam control panel 2c having an opening 2d. The beam control panel 2c is disposed between the first condenser lens 2a and the second condenser lens 2b.

The sample chamber 16 includes: an XYZ stage 5 which allows a sample 7 to be mounted thereon; and an electron detector 8 which detects secondary electrons or the like emitted from the sample 7. In addition, the sample chamber 16 is connected to a motor (not shown) and an evacuator (not shown). The motor is used to move the XYZ stage 5, and the evacuator is used to keep the inside of the sample chamber 16 at a predetermined low pressure atmosphere.

An electron beam 9 emitted from the electron gun 1 is designed to be emitted (irradiated) onto the sample 7 mounted on the XYZ stage 5 through the condenser lens unit 2, the deflection coil 3, and the objective lens 4.

The amount of secondary electrons or reflection electrons emitted from the sample 7 in response to the emission (irradiation) of the electron beam 9 is detected by the electron detector 8 which includes a secondary electron control electrode 8a, a scintillator, and the like. An AD converter in the signal processing unit 30 converts the detected amount of secondary electrons into a digital amount, and further converts the digital amount into a luminance signal. Then, the luminance signal is displayed on the display unit 40. An electron deflection amount of the deflection coil 3 and an image scanning amount of the display unit 40 are controlled by the control unit 20.

The control unit 20 is formed of a microcomputer and stores a program to execute a measurement. In addition, the control unit 20 determines an acceleration voltage of the electron beam 9, and applies the acceleration voltage to the electron gun 1 to which the control unit 20 is electrically connected.

The charged particle beam inspection apparatus 100 configured in the above-described manner performs processing to stabilize the potential on the sample 7 mounted on the XYZ stage 5 in order to observe or measure the sample 7.

(Processing to Stabilize Potential on Sample Surface)

Processing to stabilize the potential on a sample surface is performed prior to observation or measurement of the sample 7 to make the potential on the surface of the sample 7 uniform. The principle of this processing will be described below.

Figure 2:
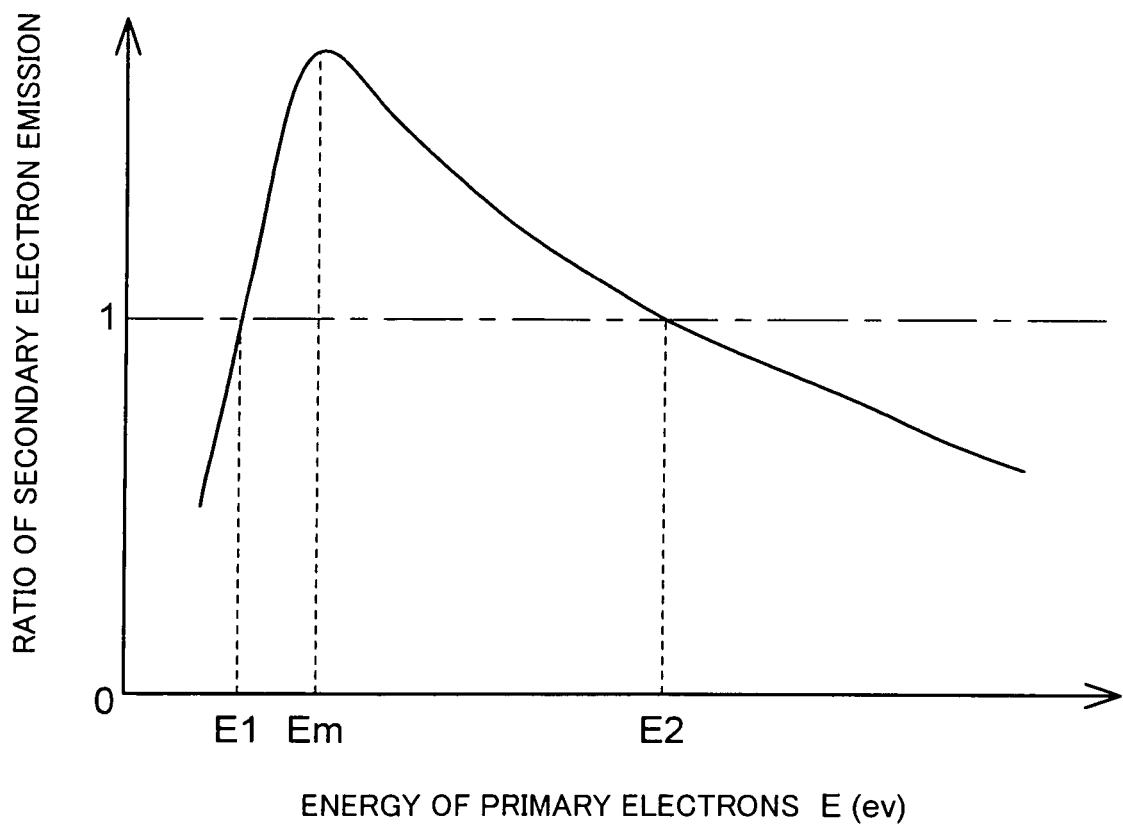
FIG. 2 is a graph showing a relationship between the energy of primary electrons and the ratio of secondary electron emission.

FIG. 2 schematically shows a relationship between the energy of primary electrons and the ratio of secondary electron emission. As shown in FIG. 2, as the energy of the primary electrons is increased from low to high, the ratio of secondary electron emission also increases and reaches 1 when the energy of the primary electron is at an energy level E1. With a further increase of the energy of the primary electrons to reach to an energy level Em, the ratio of secondary electron emission reaches the maximum. When the energy of the primary electrons goes beyond an energy level E2, the ratio of secondary electron emission becomes lower than 1. In this respect, values of the energy of the primary electrons at the energy levels E1, Em, and E2 change depending on a material used in a sample, but where the value at the point Em falls within 500 [eV] to 1000 [eV] in most of the cases.

Figure 3A:
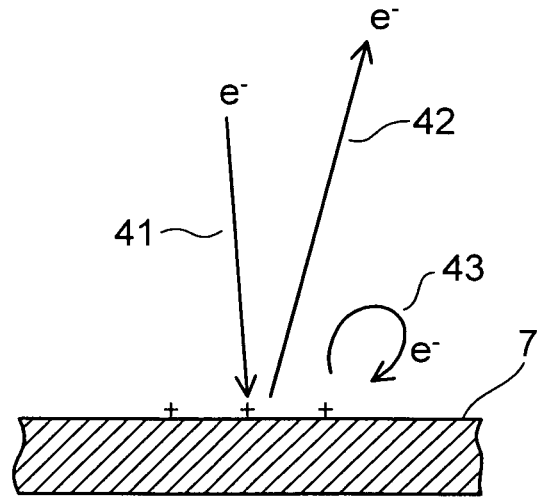
FIGS. 3A and 3B are diagrams each showing a relationship between the ratio of secondary electron emission and a charging state on a sample surface.
Figure 3B:
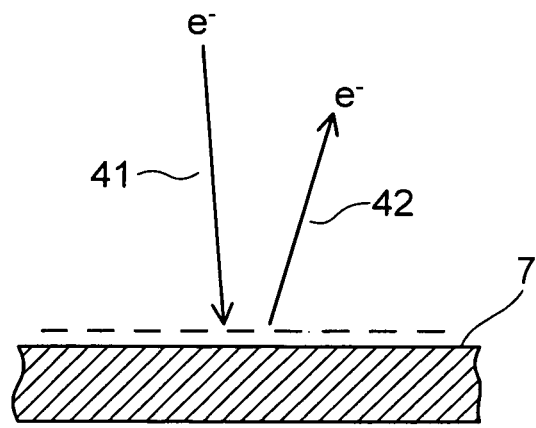

FIGS. 3A and 3B each schematically show a relationship between the ratio of secondary electron emission and a charging state on a surface of an insulating film of a sample 7. FIG. 3A shows a case where the ratio of secondary electron emission is greater than 1. In a range where the ratio of secondary electron emission is greater than 1, the number of the secondary electrons 42 emitted from the sample 7 exceeds the number of the primary electrons 41 incident on the sample 7. Thus, the surface of the sample 7 is positively charged. In contrast, FIG. 3B corresponds to a case where the ratio of secondary electron emission is smaller than 1 and where the energy of the primary electrons is lower than that at the energy level E1 or is higher than that at the energy level E2 shown in FIG. 2. In a range where the ratio of secondary electron emission is smaller than 1, a number of electrons remain on the surface of the sample 7, so that the surface of the sample 7 is negatively charged.

When the energy of the primary electrons is sufficiently large and the ratio of secondary electron emission is smaller than 1, the surface of the sample 7 is negatively charged, and thus the primary electrons decelerate in the vicinity of the sample 7. This charging phenomenon proceeds until the energy of the primary electrons is reduced to that at the point energy level E2 and the ratio of the secondary electron emission comes close to 1. The charging voltage in this charging is the difference between the energy at the energy level E2 and the energy of the primary electrons, and the surface of the sample 7 may be charged at a large negative value (a value less than −100 [V], for example) in some cases. Once such a charging occurs, a secondary electron image is largely distorted and a measurement error becomes large.

On the other hand, when the ratio of secondary electron emission is greater than 1, the surface of the sample 7 is positively charged. Nevertheless, the surface of the sample 7 when charged by several voltages [V] draws relatively large amount of the secondary electrons 43 back thereto, since the secondary electrons 43 only have several voltages [eV] of energy. An incident current obtained by adding, to the primary electrons, the secondary electrons drawn back to the surface is evenly balanced with an emission current including the emitted secondary electrons. Accordingly the charging does not proceed any further. For this reason, the observation or the like of the sample 7 is made in the range where the ratio of the secondary electron emission is greater than 1.

Conventionally, uniform charging has been obtained by controlling changes in potential on a sample surface by changing energy of an emitted electron beam in order that the potential of the sample surface is charged positively or negatively. This control takes time until the potential of the sample surface is stabilized, thereby leading to a problem of deterioration in throughput.

The present embodiment has been made focusing on controlling condenser lenses in order to obtain a current needed to stabilize the potential of a sample surface in a short time.

Figure 4:
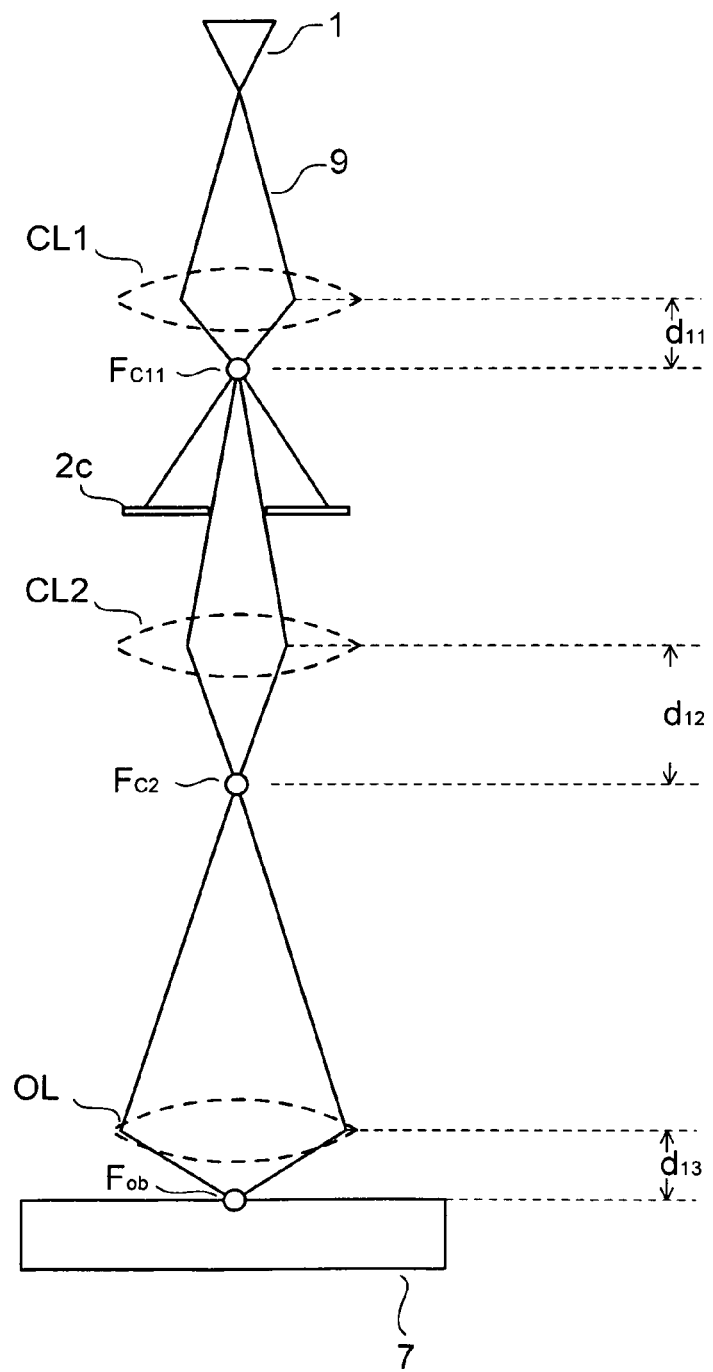
FIG. 4 is a diagram explaining a track of an electron beam which the charged particle beam inspection apparatus shown in FIG. 1 emits at the measurement.

FIG. 4 is a schematic diagram showing a track of an electron beam 9 emitted at the measurement (in a regular state). In FIG. 4, a first condenser lens CL1, a second condenser lens CL2, and an objective lens OL are each schematically shown as a convex lens shown by a broken line.

The electron beam 9 emitted from the electron gun 1 is converged by the first condenser lens CL1, and then is focused on a point FC11 which is located a distance (focal distance) d11 from the principal surface of the first condenser lens CL1. Here, the principal surface is a surface which is perpendicular to an optical axis and passes through the center of a lens schematically shown.

The electron beam 9 having passed through the opening 2d of the beam control panel 2c is further converged by the second condenser lens CL2, and is focused on a point FC2 which is located a distance d12 from the principal surface of the second condenser lens CL2. The electron beam 9 is then converged by the objective lens OL, and is finally irradiated on the sample 7.

The amount of the current of the electron beam 9 irradiating on the sample 7 changes depending on the rate of the electron beam 9 passing through the opening 2d of the beam control panel 2c to the entire electron beam 9.

Figure 5A:
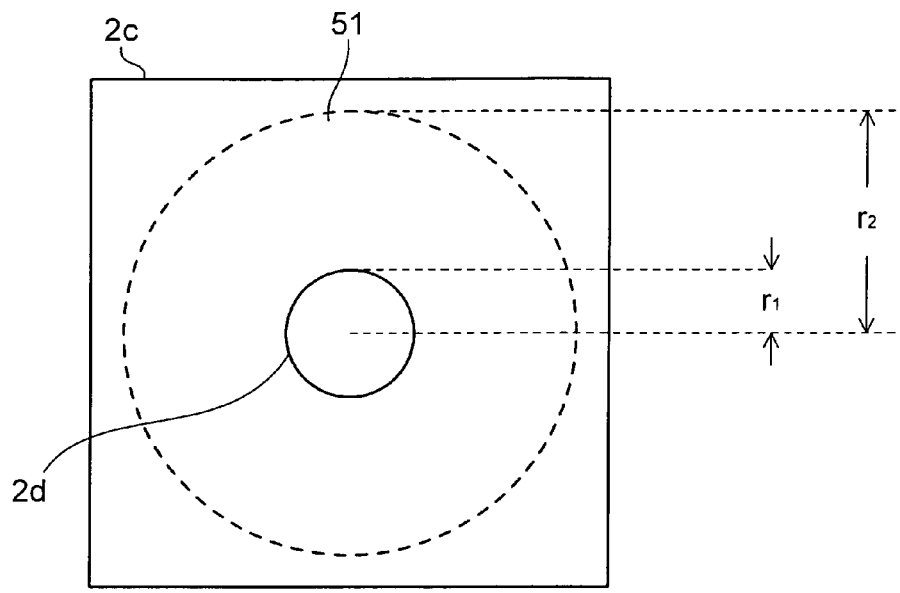
FIGS. 5A and 5B are diagrams each explaining an electron beam which is emitted onto a beam control panel.
Figure 5B:
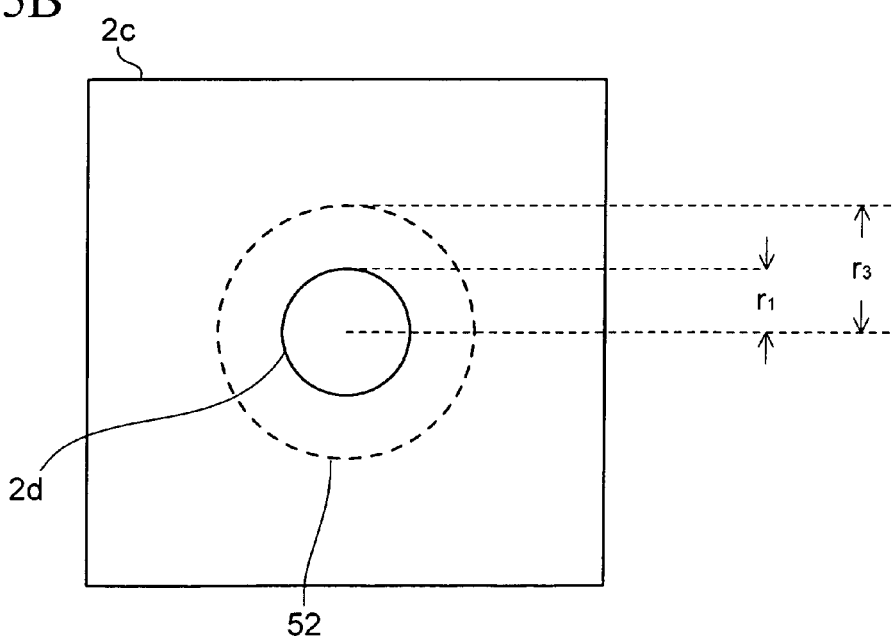

FIGS. 5A and 5B are plan views each showing an electron beam 9 emitted (irradiated) on the beam control panel 2c. FIG. 5A shows an emission range 51 of the electron beam 9 at the measurement. In a case where an electron beam 9 having the amount of current I is uniformly emitted on the circular emission range 51, the amount of the current of the electron beam 9 passing through the opening 2d is expressed by $(r_1^2/r_2^2)$ I where the radius of the opening 2d is $r_1$ and the radius of the emission range 51 is $r_2$. FIG. 5B shows a case of having where an emission range 52 of an electron beam 9 which is smaller than the emission range 51 in FIG. 5A. The total amount of the current of the electron beam remains unchanged regardless of the size of the emission ranges 51 or 52 of the electron beam. Therefore, in the case of having the smaller emission range 52 of the electron beam 9 as shown in FIG. 5B, the amount of the current of the electron beam 9 passing through the opening 2d is expressed by $(r_1^2/r_3^2)$I. This value is larger than that of the case shown in FIG. 5A.

Accordingly, if the emission range of the electron beam 9 emitted on the beam control panel 2c is regulated as shown in FIG. 5B to be smaller than the emission range 51 for the measurement, the amount of the current of the electron beam 9 emitted on the sample 7 can be increased compared to the amount thereof for the measurement.

Figure 6:
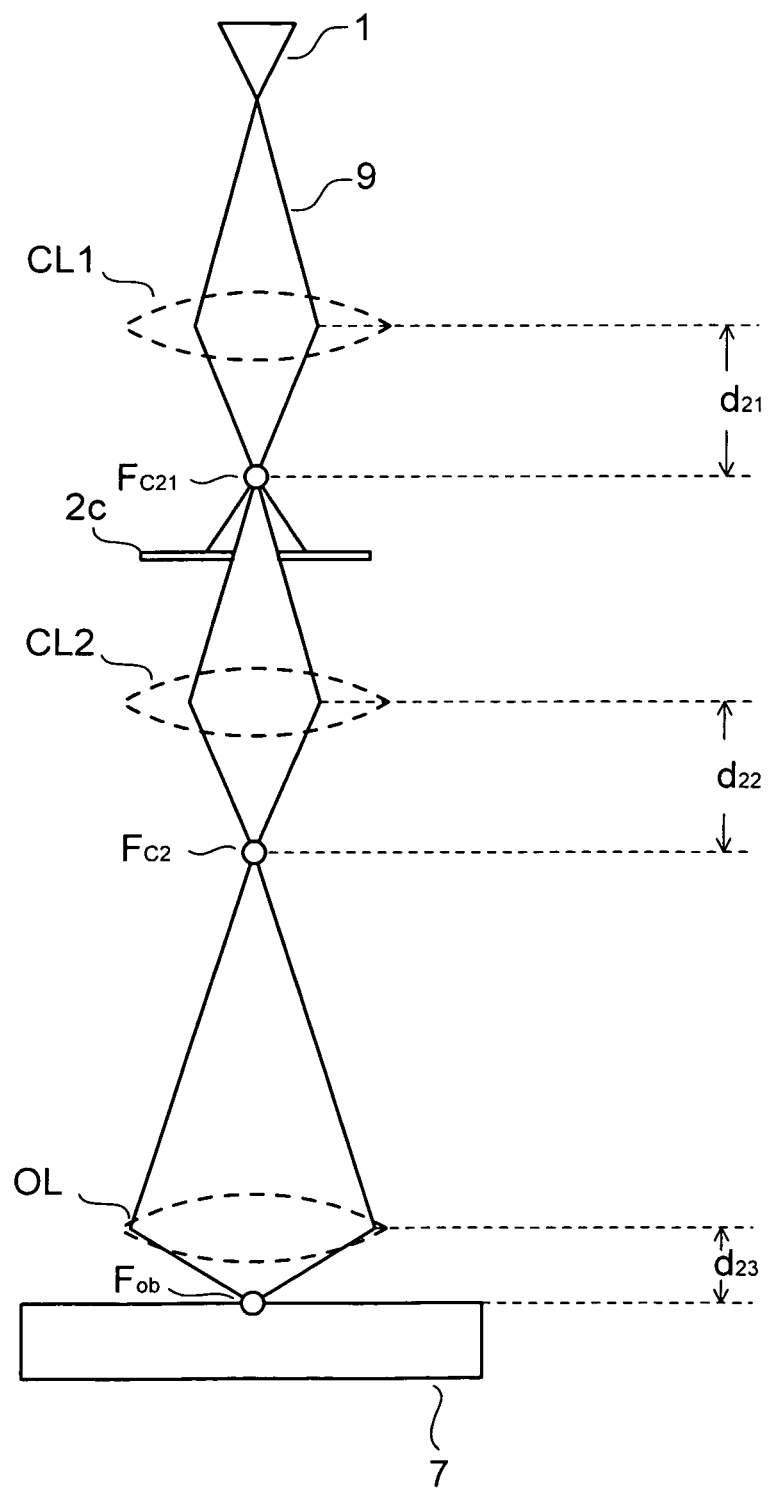
FIG. 6 is a diagram explaining a track of an electron beam which the charged particle beam inspection apparatus shown in FIG. 1 emits at stabilizing processing.

FIG. 6 is a schematic diagram showing a track of an electron beam 9 generated at the stabilizing processing. As shown in FIG. 6, the focal distance d21 of the first condenser lens CL1 is made longer than the focal distance d11 of the first condenser lens CL1 for the measurement in order to narrow the emission range of the electron beam 9 emitted on the beam control panel 2c.

The first condenser lens CL1 is formed of a magnetic coil. The value of excitation current supplied to the magnetic coil is made smaller than the value of excitation current supplied thereto for the measurement, in order to make the focal distance d21 of the first condenser lens CL1 longer than the focal distance d11 set for the measurement.

A large amount of the electron beam 9 having passed through the opening 2d further undergoes convergence by the second condenser lens CL2. At this time, a focal distance d22 of the second condenser lens CL2 is regulated so as to be equal to the focal distance d12 of the second condenser lens CL2 for the measurement. Here, the focal distance d22 is regulated to be equal to the focal distance d12 for the measurement in a way that the value of excitation current supplied to a magnetic coil constituting the second condenser lens CL2 is made larger than the value of excitation current supplied thereto for the measurement.

Setting the focal distance d22 of the second condenser lens CL2 to be equal to the focal distance d12 for the measurement allows the electron beam 9 to be focused in the same visual field as that for the measurement by not changing the magnification of the objective lens OL, and allows the amount of the current of the electron beam 9 emitted onto the sample 7 to be increased compared to that for the measurement.

Regulating the values of the excitation currents to be supplied to the lenses in this way makes it possible to increase or decrease, easily at high speed, the amount of the current of the electron beam to be emitted on the sample.

In the present embodiment, conditions to stabilize the potential on a sample surface are: the excitation current to be supplied to each of the first and the second condenser lenses CL1 and CL2; and a time period during which a current larger than that for the measurement is emitted onto the sample 7.

Figure 7:
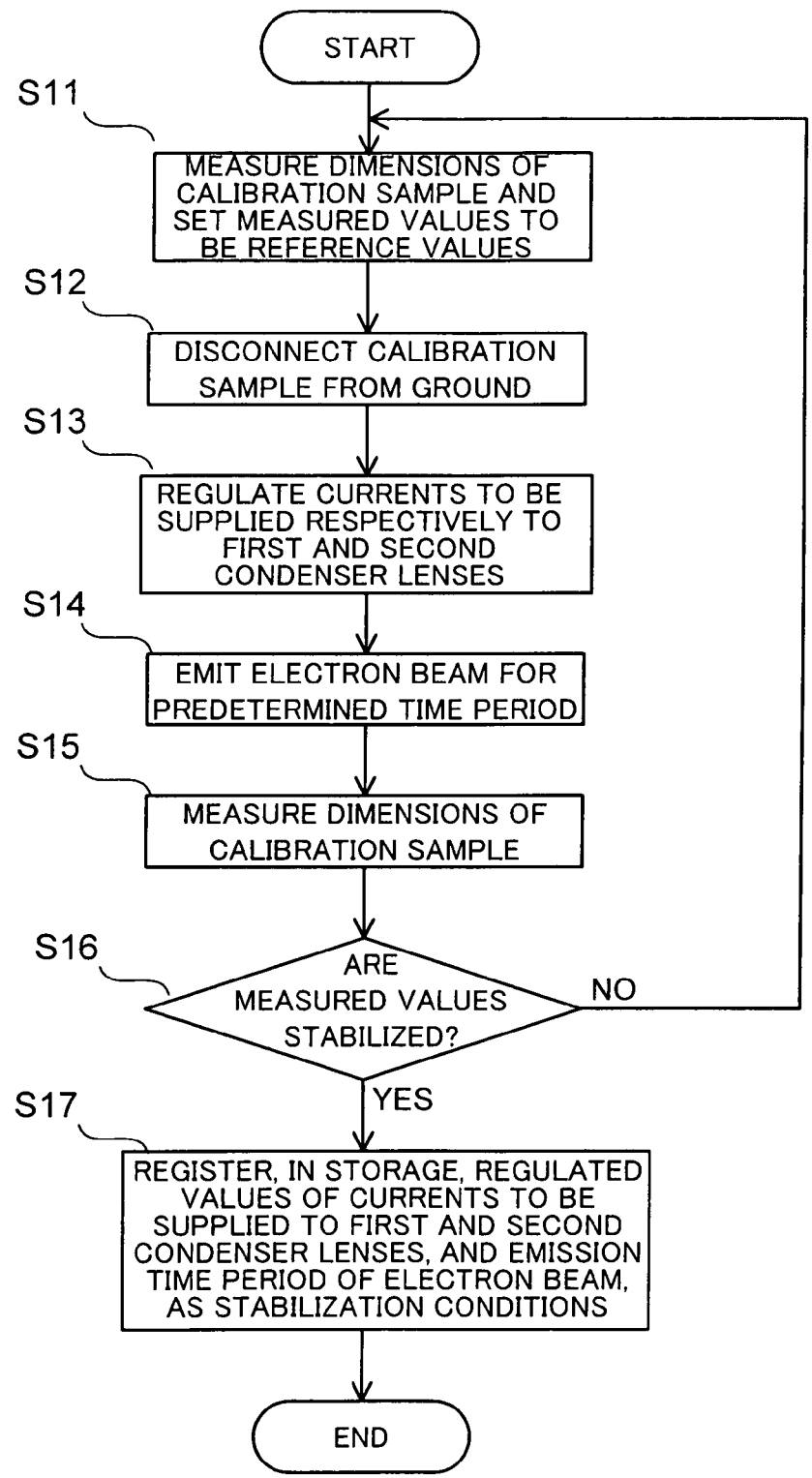
FIG. 7 is a flowchart showing processing to determine a value of current to be supplied to each of a first condenser lens and a second condenser lens.

Hereinbelow, a description will be given of a method of determining the stabilizing conditions with reference to the flowchart shown in FIG. 7.

Firstly, in Step S11, reference dimensions are measured by use of a calibration sample. The calibration sample is made of the same material as the sample 7 which is a measurement target.

The calibration sample is formed of a substrate which is entirely conductive, and the dimensions of the calibration sample are known in advance or will be measured in the first step. This calibration sample is grounded to be in a discharging state where the potential on the surface of the calibration sample is 0 [V]. Then, the dimensions of the calibration sample are measured and thereby set to be reference dimensions. The measurement is made by scanning the calibration sample while emitting (irradiating) the electron beam onto the calibration sample, and then obtaining an image from which the dimensions are obtained.

In next Step S12, the calibration sample is disconnected from the ground. The disconnection of the calibration sample from the ground causes the sample surface to be charged positively or negatively.

In next Step S13, the currents to be supplied respectively to the magnetic coils of the first and the second condenser lenses CL1 and CL2 are respectively set to predetermined values. For example, the current to be supplied to the magnetic coil of the first condenser lens CL1 is set to a value which is smaller than the current value set for the measurement, whereas the current to be supplied to the magnetic coil of the second condenser lens CL2 is set to a value which is larger than the current value set for the measurement. Here, the focal distance d22 is set to be equal to the focal distance d12 set for the measurement to maintain the same magnification condition of the objective lens OL. These settings allow the emission of a large amount of electron beam 9, for example, 10 times or more compared to that for the measurement.

In next Step S14, in order to stabilize the charge on the sample surface, predetermined amounts of currents are respectively supplied to the magnetic coils of the first and the second condenser lenses CL1 and CL2. Under this setting, the electron beam 9 is emitted for a predetermined time period. Since a large amount of electron beam 9 is emitted at this time, the time period required for the emission can be considerably reduced to 1/10 or less, for example, of a time period conventionally required.

In next Step of S15, the conditions for the electron beam 9 are switched back to the ones for the measurement, and then an electron microscope image for the calibration sample is obtained to measure the calibration sample. Specifically, the currents to be respectively supplied to the magnetic coils of the first and the second condenser lenses CL1 and CL2 for the measurement of the calibration sample are not the currents regulated at Step S13 and determined at Step S17, but the currents set for the measurement. Namely, the currents values are switched back to those for the measurement to obtain the electron microscope image of the calibration sample and then to measure the calibration sample.

In next Step S16, it is determined whether or not the measured values of the calibration sample are stabilized. The measurement of the calibration sample is performed in Step S15 after the electron beam is emitted on the sample for a predetermined time period from the time point t=0 in order to stabilize the charge on the sample surface in Step S14. Then, in a case, for example, where the difference between a value measured at a time point $t_1$ and a value measured at a time point $t_2$ is within a tolerable variation, it is determined that the measured values are stabilized. Here, the time point $t_1$ and the time point $t_2$ are time points during the emission time period of the electron beam 9.

Further in Step S16, the measured values are compared with the reference values obtained in Step S11. A difference (denoted by D) between each measured value and the corresponding reference value is obtained, and then it is determined whether or not the difference D is smaller than a predetermined value, for example, 0.2 [nm]. When it is determined that the difference D is smaller than the predetermined value, the emission time period is considered to be appropriate. Therefore, the emission time period $t_x$ of the electron beam 9 is stored in a storage 45 (FIG. 1), and then the processing proceeds to Step S17. On the other hand, when it is determined that the difference D is larger than the predetermined value, the processing proceeds to Step S11 to measure reference values again by use of the calibration sample. Then, the processing proceeds to Step S13 to change the amounts of the currents to be supplied to the first and the second condenser lenses CL1 and CL2. Then, the processing continues further. Note that the processing may proceed directly to Step S13, if desired, when it is determined that the difference D is larger than the predetermined value.

In next Step S17, the stabilizing conditions are stored in the storage 45, and the processing is terminated. Here, the stabilizing conditions include: the value, set in Step S13, of the excitation current supplied to the magnetic coil of each of the first and the second condenser lenses CL1 and CL2; and the emission time period $t_x$ of the electron beam 9 obtained in Step S16.

Here, the stabilizing conditions vary depending on a material of a used sample. Therefore, the stabilizing conditions for various materials of samples may be obtained and stored in the storage 45.

As described above, in the charged particle beam inspection apparatus according to the present embodiment, the excitation current supplied to the first condenser lens is set to be smaller than that supplied thereto for the measurement, in order to increase the focal distance of the first condenser lens. Consequently, the area of the beam control panel on which the electron beam is emitted is narrowed so that the amount of the electron beam passing through the opening of the beam control panel is relatively increased compared to that for the measurement. In this way, the amount of current of the electron beam emitted (irradiated) on the sample is increased. The emission, for a predetermined time period, of a large amount of electron beam thus regulated makes it possible to stabilize the potential on a sample surface in a short time. As a result, a track of the electron beam is made steady, and dimensions of a pattern on the sample can be measured with accuracy.

Additionally, in the present embodiment, the amount of current to be supplied to each of the first and the second condenser lenses (one of the stabilizing conditions) is obtained in advance in order to stabilize the above-described potential. Here, the amount of current corresponds to a desired time period to be spent for stabilizing. The stabilizing conditions for each sample are stored in the storage 45 shown in FIG. 1. Since the charged particle beam inspection apparatus automatically performs the stabilizing processing with reference to the stabilizing conditions stored in the storage, a user can save time and labor considerably.

Figure 8:
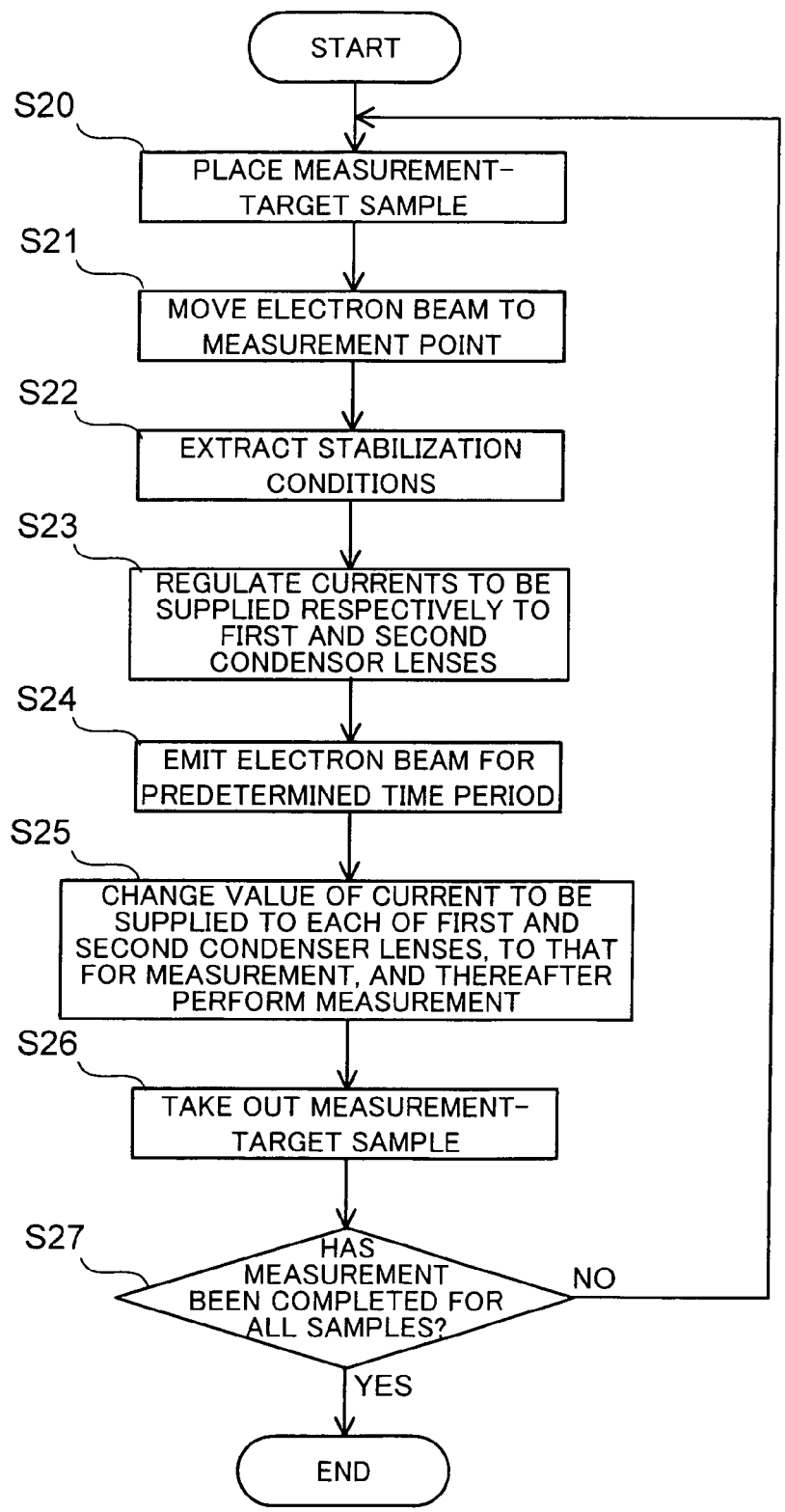
FIG. 8 is a flowchart showing an inspection method using a charged particle beam.

Next, with reference to a flowchart shown in FIG. 8, a description will be given of a method of measuring the sample 7 by with use of the charged particle beam inspection apparatus 100 of the present embodiment by stabilizing the potential on the sample 7. Here, it is assumed that a measuring point and stabilizing conditions for each measurement target sample are stored in the storage 45 in advance.

Firstly, in Step S20, a sample 7 is brought in the sample chamber 16.

In next Step S21, the controlling unit 20 extracts a measurement point for the sample 7 from the storage 45, and moves an irradiation position to the measurement point by controlling the deflection coil 3.

In next Steps S22 to S24, the surface of the sample 7 undergoes stabilizing processing.

In Step S22, stabilizing conditions for the sample 7 are extracted from the storage 45.

In Step S23, the value of the excitation current to be supplied to the first and the second condenser lenses CL1 and CL2 are regulated according to the values of the excitation currents included in the extracted stabilizing conditions.

In next Step S24, an electron beam is emitted on the sample 7 according to an emission time period of the electron beam included in the extracted stabilizing conditions.

In next Step S25 which is after the stabilizing processing, the value of the excitation current to be supplied to each of the first and the second condenser lenses CL1 and CL2 is changed to the one for the measurement while the potential on the surface of the sample 7 is stabilized. Then, the sample 7 is measured.

Steps S21 to S25 are repeated until all the measurement points in the sample 7 are measured.

In next Step S26, the sample 7 for which the measurements have been completed is taken out of the sample chamber 16.

In next Step S27, it is determined whether or not the measurement has been completed for all samples 7. If all the measurements have not been completed, the processing returns to Step S20 to continue the remaining measurements.

As described above, in the measurement method by use of the charged particle beam inspection apparatus of the present embodiment, the potential of the sample surface around the measurement point on the sample is stabilized prior to the measurement of the dimensions of the pattern formed on the sample. Before measuring the sample, the charged particle beam inspection apparatus automatically performs optimal stabilizing processing on the potential of each sample with reference to the stabilizing conditions stored in the storage 45 in advance. This processing stabilizes the potential of the sample surface in a short time as desired. Therefore, the electron beam is not affected by various different potentials on the sample, so that the electron beam does not change its emission range. Thus, this measurement method enables a steady measurement. Furthermore, a user can save time and labor considerably, because the charged particle beam inspection apparatus automatically performs the stabilizing processing with reference to the stabilizing conditions stored in the storage 45.

Note that, in the present embodiment, the descriptions are given of a case where the charged particle beam inspection apparatus is applied to the measurement of dimensions of a pattern. However, the application of the charged particle beam inspection apparatus is not limited to this example. For example, the charged particle beam inspection apparatus may be applied to a defect detection of an element pattern formed on a semiconductor substrate, for example.

In addition, in the present embodiment, the calibration sample is used to obtain the emission time period required for stabilizing the potential of the sample surface. However, the emission time period may be firstly obtained using the measurement target sample 7 in place of the calibration sample. In this case, the emission time period is determined in the following way. Specifically, the electron beam is emitted on the sample 7 to obtain the measurement values, and then a time period during which the relative measurement variation between each two of the multiple measurement values thus obtained is within a tolerable variation is set to be the emission time period.

Further, the emission region to be stabilized may be made smaller than the measurement region of the measurement target sample 7, for example, a minimum size in such a way that the difference between the measured value and the reference value falls within a range of tolerable variation. With this emission region, the emission time period required for stabilizing can be minimized.

Furthermore, during the stabilization of the potential on the surface of the sample 7, focusing conditions for the first and the second condenser lenses CL1 and CL2 and the objective lens CL3 may be controlled so that the electron beam can be focused on the sample 7. Alternatively, focusing conditions for the first and the second condenser lenses CL1 and CL2 and the objective lens CL3 may be controlled so that the electron beam can be diffused on the sample 7. In the latter case, the sample 7 is prevented from being locally damaged.

What is claimed is:

1. A charged particle beam inspection apparatus comprising:
    an electron gun for emitting an electron beam;
    a first condenser lens and a second condenser lens used for focusing the electron beam;
    a beam control panel for controlling the electron beam passing there through and is provided between the first condenser lens and the second condenser lens; and
    a control unit for performing stabilizing processing that stabilizes a potential on a surface of a sample by the following operations:
        an excitation current to be supplied to the first condenser lens is set to be smaller than the excitation current supplied thereto for a measurement of dimension of the sample to increase a focal distance of the first condenser lens, and;
        an excitation current to be supplied to the second condenser lens is set to be larger than the excitation current supplied thereto for the measurement to regulate a focal distance of the second condenser lens to be equal to a focal distance thereof for the measurement, thereby
        a current amount of the electron beam passing through an opening of the beam control panel is regulated so that the electron beam to be emitted onto the sample has a larger current amount than that at the measurement, and then
        the electron beam is emitted onto the sample for a predetermined time period, thereby stabilizing the potential on the surface of the sample.

2. The charged particle beam inspection apparatus according to claim 1, wherein
    after finishing the stabilizing processing, the control unit sets the values of the excitation currents back to values for the measurement, and then the measurement of a dimension of the sample is performed, the excitation currents respectively supplied to the first condenser lens and the second condenser lens.

3. The charged particle beam inspection apparatus according to claim 1, wherein
    the predetermined time period is a time period required for a potential on the surface of the sample to be stabilized after the electron beam thus regulated is emitted onto the sample, and is shorter than a time period required for a potential on the surface of the sample to be stabilized after the electron beam for the measurement is emitted onto the sample.

4. The charged particle beam inspection apparatus according to claim 1, further comprising
    a storage to store the values of the excitation currents to be respectively supplied to the first condenser lens and the second condenser lens, wherein
    the control unit sequentially extracts, from the storage, a value of a first excitation current to be supplied to the first condenser lens, a value of a second excitation current to be supplied to the second condenser lens, and an emission time period, the values and the emission time period set for the stabilizing processing,
    supplies the first excitation current to the first condenser lens to make a focal distance of the first condenser lens longer than a focal distance thereof for the measurement,
    supplies the second excitation current to the second condenser lens to regulate a focal distance of the second condenser lens to be equal to a focal distance thereof for the measurement, and
    emits the electron beam onto the sample for the emission time period to stabilize a potential on a surface of the sample.

5. An inspection method using a charged particle beam to measure a dimension of a pattern formed on a sample by use of a charged particle beam inspection apparatus, the apparatus including: an electron gun emitting an electron beam; a first condenser lens and a second condenser lens used to focus the electron beam; a beam control panel disposed between the first condenser lens and the second condenser lens; a storage to store values of excitation currents to be respectively supplied to the first condenser lens and the second condenser lens; and a control unit controlling the electron gun, the first condenser lens, and the second condenser lens, the method comprising the steps of:
    extracting, from the storage, the value of the excitation current to be supplied to the first condenser lens, the value of the excitation current to be supplied to the second condenser lens, and an emission time period;
    supplying the excitation currents respectively to the first condenser lens and the second condenser lens, where the excitation current to be supplied to the first condenser lens is set smaller than the excitation current supplied thereto for the measurement of the dimension of the sample to make a focal distance of the first condenser lens longer than a focal distance thereof for the measurement, and the excitation current to be supplied to the second condenser lens is set larger than the excitation current supplied thereto for the measurement to set a focal distance of the second condenser lens to be equal to a focal distance thereof for the measurement, to regulate the electron beam passing through an opening of the beam control panel so that the electron beam to be emitted onto the sample has a larger current amount than that at the measurement;

emitting the electron beam onto the sample for the emission time period which is extracted from the storage thereby stabilizing a potential on a surface of the sample; and after the emission of the electron beam, measuring the pattern on the sample by setting the values of the excitation currents to be supplied respectively to the first condenser lens and the second condenser lens back to values for the measurement.

6. The inspection method using a charged particle beam according to claim 5, wherein the emission time period is a time period required for a potential on the surface of the sample to be stabilized after the electron beam thus regulated is emitted onto the sample, and is shorter than a time period required for a potential on the surface of the sample to be stabilized after the electron beam for the measurement is emitted onto the sample.

7. A charged particle beam inspection apparatus comprising:

an electron gun emitting an electron beam;

a first condenser lens forming, upon receipt of the electron beam emitted from the electron gun, a first focused beam which focuses at a position located a predetermined first focal distance away from the first condenser lens;

a beam control panel forming a passed beam upon receipt of the first focused beam, the passed beam formed of a portion of the first focused beam passing through a predetermined opening formed in the beam control panel and located at a center of an optical axis;

a second condenser lens forming, upon receipt of the passed beam, a second focused beam which focuses at a position located a predetermined second focal distance away from the second condenser lens;

an objective lens emitting, upon receipt of the second focused beam, the second focused beam onto an irradiation target sample a predetermined third focal distance away from the objective lens; and a control unit controlling, in order to perform a stabilizing processing a potential on a surface of the sample, focusing conditions by increasing the first focal distance of the first condenser lens to be longer than that of a measurement processing of dimension of the sample, and regulating the second focal distance of the second condenser lens to be equal to a focal distance thereof for the measurement processing in a way that the passed beam passing through the opening becomes larger in such a way that the electron beam to be emitted onto the sample has a larger current amount in the stabilizing processing than that at the measurement processing.

* * * * *